United States Patent [19]
Mori et al.

[11] Patent Number: 5,303,173
[45] Date of Patent: Apr. 12, 1994

[54] ADAPTIVE DIGITAL FILTER, AND METHOD OF RENEWING COEFFICIENTS THEREOF

[75] Inventors: Shinsaku Mori, 1-31-6, Okuzawa, Setagaya-ku; Kiyoshi Takahashi, both of Tokyo, Japan

[73] Assignees: Shinsaku Mori; TEAC Corporation, both of Tokyo, Japan

[21] Appl. No.: 936,909

[22] Filed: Aug. 27, 1992

[30] Foreign Application Priority Data

Aug. 29, 1991 [JP] Japan .................................. 3-244625

[51] Int. Cl.$^5$ .............................................. G06F 15/31
[52] U.S. Cl. ............................................. 364/724.19
[58] Field of Search ............ 364/724.01, 724.16, 364/724.17, 724.19, 724.20

[56] References Cited

U.S. PATENT DOCUMENTS

| | | | |
|---|---|---|---|
| 4,524,424 | 6/1985 | White ..................... | 364/724.19 |
| 4,843,583 | 6/1989 | White et al. ............. | 364/724.19 |

OTHER PUBLICATIONS

Takahari, "Performance Improvement of LMS Algorithm Using Hopfield Model Network", IEEE Global Telecommunications Conference and Exhibition, vol. 2, pp. 1356-1360, 1990.

Takahashi, "Performance Improvement of LMS Algorithm," The Transactions of the Institute of Electronics, Information and Communication Engineers, vol. 74-A, No. 1 (Jan. 25, 1991), pp. 19-24.

Mitsuo Takeda et al., "Neural Networks for Computation: Number Representations and Programming Complexity," Applied Optics, vol. 25, No. 18 (Sep. 15, 1986), pp. 3033-3046.

*Primary Examiner*—Jerry Smith
*Assistant Examiner*—Chuong D. Ngo
*Attorney, Agent, or Firm*—Woodcock Washburn Kurtz Mackiewicz & Norris

[57] ABSTRACT

An adaptive digital filter has a series of delay elements for imparting a unit delay of one sampling interval to successive input data samples in order to concurrently obtain a set of data samples of different sampling items. Each set of data samples are multiplied by respective coefficients, and the resulting multiplier outputs are added together into a filter output for comparison with a reference signal. The coefficients are renewed a preassigned number of times during each sampling interval, and the last renewed coefficients are used for each new set of data samples. For such coefficient renewal, a plurality of arithmetic circuits are connected in parallel for simultaneously performing the necessary computations for the renewal of all the coefficients.

1 Claim, 6 Drawing Sheets

ADAPTIVE DIGITAL FILTER, AND METHOD OF RENEWING COEFFICIENTS THEREOF

BACKGROUND OF THE INVENTION

This invention relates to an adaptive filter which is a type of digital filter used for noise canceling, system modeling, among other applications, and to a method of renewing its coefficients for each new set of input data samples.

A variety of algorithms have been devised and used for adaptive data processing. Examples are the least mean square (LMS) algorithm and the recursive least square (RLS) algorithm. The LMS algorithm in particular has been used most extensively by virtue of a smaller amount of computations required, simplicity of circuitry, and ease of implementation, even though it is poorer in convergence than the other algorithms.

FIG. 1 of the attached drawings shows a prior art adaptive digital filter based on the LMS algorithm. It has an input terminal 10 for receiving input data samples $x(k)$ at constant sampling intervals. The input terminal 10 is connected to a series of L (integer of more than one) delay elements $M_1, M_2, \ldots M_L$ which successively impart a unit delay of one sampling interval to the input data samples $x(k)$. Accordingly, $(L+1)$ input data samples $x(k), x(k-1), x(k-2), \ldots x(k-L)$ of different sampling intervals are obtained concurrently on $(L+1)$ lines $C_0-C_L$, respectively, which are connected respectively to the input terminal 10 and to the outputs of the delay elements $M_1-M_l$. Multipliers $A_0, A_1, \ldots A_L$ multiply the input data samples $x(k)-x(k-L)$ by respective coefficients $w_0(k), w_1(k), \ldots w_L(k)$, thereby producing outputs $x(k)w_0(k), x(k-1)w_1(k), \ldots x(k-L)w_L(k)$. These outputs $x(k)w_0(k)-x(k-L)w_L(k)$ are all directed into an adder 12 thereby to be added together into an output $y(k)$. This output $y(k)$ is then applied to a difference detector 14, which produces a difference signal $e(k)$ representative of the difference between the adder output $y(k)$ and a reference signal $d(k)$.

The adder output $y(k)$ and the difference detector output $e(k)$ can be expressed as:

$$y(k) = w_0(k)x(k) + w_1(k)x(k-1) \ldots + w_L(k)x(k-L) \quad (1)$$

$$e(k) = d(k) - y(k). \quad (2)$$

In adaptive digital filters in general, the coefficients $w_0(k)-w_L(k)$ are renewed for each sampling interval by a digital signal processor. Each set of input data samples $x(k)-x(k-L)$ on the lines $C_0-C_L$ are multiplied by each renewed set of coefficients. New coefficients at discrete time k are obtained by the equation:

$$w_i(k) = w_i(k-1) + 2\mu e(k-1)x(k-1) \quad (3)$$

where $k-1$ = discrete time of the sampling interval preceding that of the time k
$i$ = variable indicating the 0'th to L'th of the lines $C_0-C_L$
$w_i(k-1)$ = coefficients of the preceding sampling interval
$e(k-1)$ = difference signal of the preceding sampling interval
$x(k-1)$ = input data of the preceding sampling interval
$\mu$ = constant called stepsize.

The stepsize constant is defined by the formula:

$$0 < \mu < 1/\lambda_{max} \quad (4)$$

where
$\lambda_{max}$ = maximum of the eigenvalues of the correlation matrix of the input data $x(k)$.

Theoretically, the stepsize $\mu$ should be as great as possible purely for the purpose of speeding the convergence of the LMS algorithm. However, actually, the stepsize has the upper limit determined by the formula (4) above. Too great a value of the stepsize is also undesirable from the standpoint of system stability.

A solution to this problem is found in the article entitled "Performance Improvement of LMS Algorithm" by Takahashi in pp. 19–24 of the Vol. 74-A, No. 1 issue of *The Transactions of the Institute of Electronics, Information and Communication Engineers* published Jan. 25, 1991, by the Institute of Electronics, Information and Communication Engineers of Tokyo, Japan. Essentially, Takahashi teaches a coefficient renewal method that does not rely on the difference signal $e(k)$ but which is based upon the similarity between LMS and the Hopfield neural network model. For more details on neutral networks, reference may be had to the article entitled "Neural Networks for Computation: Number Representations and Programming Complexity" by Takeda et al. in the Volume 25, Number 18 issue of *Applied Optics* published by the Optical Society of America.

The Hopfield neural network model is shown in FIG. 2 in order to make clear its relationship with the present invention. The Hopfield model consists of a multiplicity of mutually interconnected nonlinear devices called neurons. The states of these neurons are characterized by their outputs that take binary values 0 and 1. The dynamics of neurons in the Hopfield model can be described in both discrete and continuous spaces. The strengths of interconnections between neurons are symmetrical. Input $U_i$ to each neuron i is defined as:

$$U_i = \sum_{j=1}^{N} T_{ij} V_j + I_i \quad (5)$$

where
N = number of neurons
$T_{ij}$ = elements of an interconnection matrix representing the strengths of connections
$I_i$ = bias input of each neuron i.

The output $V_i$ of each neuron i is renewed as follows in the discrete model:

$$V_i(k+1) = 1, [U_i(k) \geq 0] \quad (6)$$
$$V_i(k+1) = 0, [U_i(k) < 0].$$

If the strengths $T_{ij}$ of interconnections are symmetrical, that is, if $T_{ij} = T_{ji}$, then the network energy E expressed by the following equation will reduce to a minimum with the network operation:

$$E = -(1/2) \sum_{i=1}^{N} \sum_{j=1}^{N} T_{ij} V_i V_j - \sum_{i=1}^{N} I_i V_j \quad (7)$$

In order to associate the Hopfield model with the prior art adaptive filter of FIG. 1, the output of each neuron at the time k may be expressed as the sum of the function $g[U_i(k)]$ and the neuron output $V_i(k-1)$ at the time $(k-1)$:

$$U_i(k) = \sum_{j=1}^{N} T_{ij}(k) V_j(k-1) + I_i(k-1) \tag{8}$$

$$V_i(k) = V_i(k-1) + g[V_i(k)].$$

The function (g) is defined as follows for correspondence with the LMS algorithm:

$$g(x) = 1, (x \geq 0) \tag{9}$$
$$g(x) = -1, (x < 0).$$

The thus defined network energy can be expressed by the following equation, which is the same as Equation (7):

$$E = -(1/2) \sum_{i=1}^{N} \sum_{j=1}^{N} T_{ij} V_i V_j - \sum_{i=1}^{N} I_i V_i \tag{10}$$

The network energy as defined by Equation (10) changes as follows when the output of each neuron i changes from $V_i(k-1)$ to $V_i(k)$ from time $(k-1)$ to time k:

$$\begin{aligned}
E(k) - E(k-1) &= -[V_i(k) - V_i(k-1)] \times \\
&\quad \left[ \sum_{j=1}^{N} T_{ij} V_j(k-1) + I_i(k-1) \right] \\
&= -[V_i(k) - V_i(k-1)] U_i(k).
\end{aligned} \tag{11}$$

From the relations of Equation (9), the change of the network energy is always negative, with the energy decreasing with network operation. The square of the difference signal $e(k)$ may be used as follows in order to apply the model of Equation (8) to the prior art adaptive filter of FIG. 1:

$$\begin{aligned}
E &= [d(k) - X_k^T W_k]^2 \\
&= \sum_{i=0}^{L} \sum_{j=0}^{L} x(k-i) x(k-j) w_i(k) w_j(k) - \\
&\quad 2d(k) \left[ \sum_{i=0}^{L} x(k-i) \right] w_i(k) + d^2(k).
\end{aligned} \tag{12}$$

The energy E in Equation (12) is the quadratic function of the coefficients of the prior art adaptive filter at the time k and has a single minimum value. The output V in Equation (10) correspond to the coefficients w in Equation (12), and $T_{ij}$ and $I_i$ in Equation (10) correspond respectively to $-2x(k-i)x(k-j)$ and $2d(k)x(k-i)$. Let the former be $T_{ij}(k)$ and the latter $I_i(k)$. Then $$T_{ij}(k) = -2x(k-i)x(k-j) \tag{13}$$
$$I_i(k) = 2d(k)x(k-i).$$

The term $d^2(k)$ in Equation (12) is constant and so negligible.

In the Takahashi article cited above, $T_{ij}(k)$ and $I_i(k)$ are computed to renew the coefficients $W_0(k)-W_L(k)$ of the prior art FIG. 1 adaptive filter. More specifically, Takahashi teaches a coefficient renewal method for an adaptive digital filter of the kind comprising: (a) means for supplying a reference signal $k(k)$ at predetermined sampling times; (b) means for supplying samples of input data, associated with the reference signal, at the predetermined sampling times; and (c) data processing means for concurrently providing (L+1) input data samples, from 0'th to L'th, by successively imparting a unit delay of one predetermined sampling interval to the input data samples, for multiplying the 0'th to L'th input data samples by 0'th to L'th coefficients $w_0(k)$, $w_1(k)$, . . . $w_L(k)$, respectively, and for adding all the multiplied data samples into an output $y(k)$.

Takahashi's method comprises the steps of: (a) computing, from the (L+1) input data samples and the reference signal at any one sampling time k:

$$T_{ij}(k) = -2x(k-i)x(k-j)$$

$$I_i(k) = 2d(k)x(k-i)$$

where i and j=variable denoting the digits from 0'th to L'th $T_{ij}(k) = (L+1)^2$ values used in renewal computation of the coefficients $I_i(k) = (L+1)$ values used in renewal computation of the coefficients $x(k-i) = (L+1)$ data samples selected successively from the concurrently obtained (L+1) samples $x(k-j) = (L+1)$ data samples selected successively from the concurrently obtained (L+1) samples;

(b) renewing, on the bases of the above computed $T_{ij}(k)$ and $I_i(k)$ and the coefficients $w_0(k)-w_L(k)$ at the sampling time k, the coefficients n times, where n is an integer of at least two, during a time interval from the sampling time k to the next sampling time $(k+1)$ according to the equation:

$$w_i n(k) = w_i n - 1(k) + \mu \left[ \sum_{j=0}^{L} T_{ij}(k) w_u n - 1(k) + I_i(k) \right]$$

where $w_i n - 1$ = values of the (L+1) coefficients before being renewed at each of the n renewals $w_i n(k)$ = values of the (L+1) coefficients after being renewed at each of the n renewals $w_j n - 1(k) = (L+1)$ coefficients before being renewed;

and (c) using the values of the coefficients obtained at the n'th renewal as the coefficients for the next sampling time $(k+1)$.

The range of values of the stepsize constant for the convergence of Takahashi's modified LMS algorithm is the same as that for the conventional LMS algorithm, set forth in Equation (4). However, since Takahashi method teaches n renewals of the coefficients during each sampling interval, the time constant is $\frac{1}{4} \mu n \lambda$ which is $1/n$ of the time constant, $\frac{1}{4} \mu \lambda$, of the conventional LMS algorithm. This advantage has been offset, however, by a relatively large amount of computations required for coefficient renewal.

SUMMARY OF THE INVENTION

The present invention seeks to simplify and speed the computations required for coefficient renewal in an adaptive digital filter system of the type under consideration.

According to the invention, stated in brief, there are provided as many arithmetic circuits as there are a set of coefficients to be renewed. Thus the n renewals of the coefficients for each set of data samples can be carried out in parallel or concurrently. The process of such coefficient renewal is materially simplified as the coefficients renewed at each of the n renewals during each sampling interval can be used as initial values to be renewed at the next renewal.

The above and other features and advantages of this invention and the manner of realizing them will become more apparent, and the invention itself will best be understood, from a study of the following description and appended claims, with reference had to the attached drawings showing the closest prior art and a preferred embodiment of the invention.

DETAILED DESCRIPTION

Figure 1:
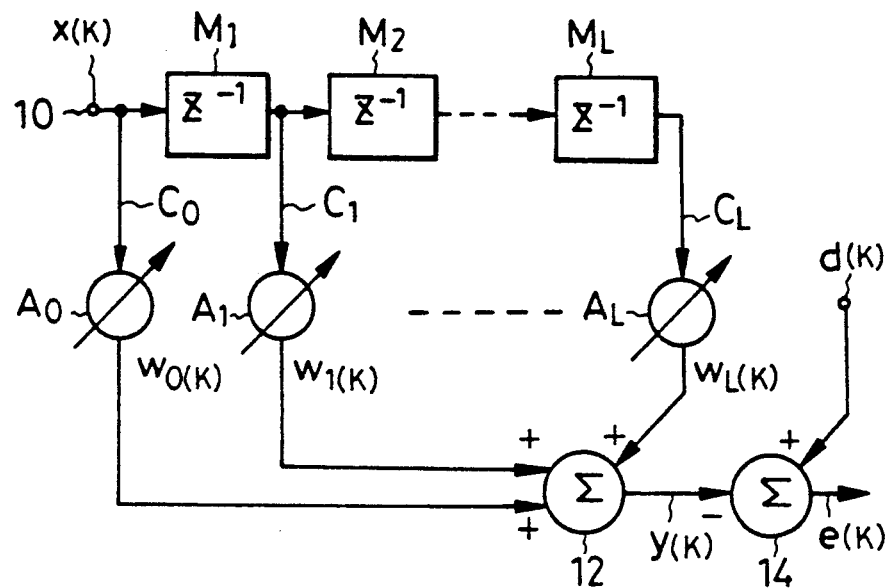
FIG. 1 is a block diagram of the prior art adaptive digital filter system.
Figure 2:
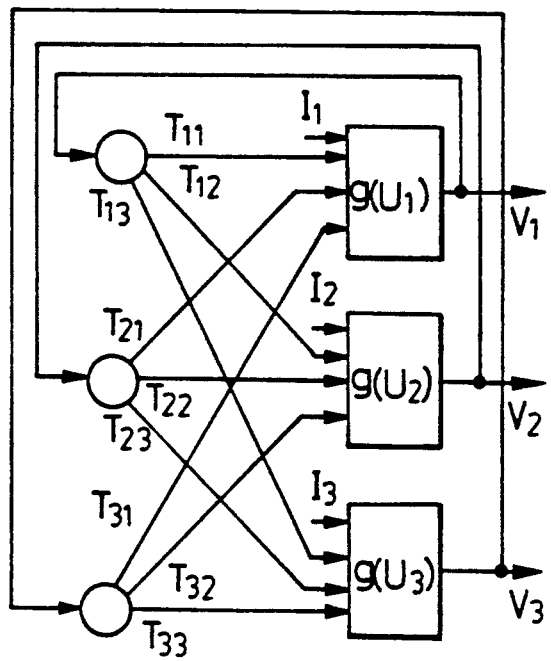
FIG. 2 is a block diagram of the known Hopfield neural network model.

The present invention will now be described in detail as embodied in the adaptive digital filter system shown in FIG. 3 and therein generally designated 20. The representative filter system 20 is shown as a combination of a transversal filter circuit 22 and a difference detector circuit 24, although in practice part or whole of the illustrated system may be computerized or constituted of an integral digital data processor.

The filter system 20 has a data input 26 for inputting data samples x(k) sampled at predetermined constant intervals. As in the prior art device of FIG. 1, the data input 26 is connected to a series of L delay elements $M_1$, $M_2$, ... $M_L$ which successively impart a unit delay of one predetermined sampling interval to the input data samples x(k). Accordingly, (L+1) input data samples x(k), x(k−1), x(k−2), ... x(k−L) of different sampling intervals are obtained concurrently on (L+1) lines $C_0$−$C_L$, respectively, connecting the input terminal 10 and the outputs of the delay elements $M_1$−$M_1$ to respective multipliers $A_0$, $A_1$, ... $A_L$. These multipliers multiply the input data samples x(k)−x(k−L) by respective coefficients $w_0(k)$, $w_1(k)$, ... $w_L(k)$, thereby producing outputs x(k)$w_0(k)$, x(k−1)$w_1(k)$, ... x(k−L)$w_L(k)$. These outputs x(k)$w_0(k)$−x(k−L)$w_L(k)$ are all directed into an adder 28 thereby to be added together into an output y(k). This output y(k) is then applied to the difference detector circuit 24, which produces a difference signal e(k) representative of the difference between the adder output y(k) and a reference signal d(k) supplied from a reference signal input 30.

The filter system 20 relies on the input data x(k) and the reference signal d(k), instead of on the difference signal e(k) as in the FIG. 1 prior art system, for renewal of the coefficients $w_0(k)$, $w_1(k)$, ... $w_L(k)$. Thus the data input 26 and the reference signal input 30 are both connected to a coefficient renewal circuit 32, which has outputs connected respectively to the multipliers $A_0$-$A_L$. The coefficient renewal circuit 32 computes and renews the coefficients $w_0(k)$-$w_L(k)$ n times during each predetermined sampling period and delivers the last set of renewed coefficients to the multipliers $A_0$-$A_L$. More will be said presently about the details of the coefficient renewal circuit 32.

The coefficient renewal circuit 32 renews the coefficients by use of $T_{ij}(k)$ and $I_i(k)$ defined in Equations (13). Since both i and j denote digits from 0 to L, $T_{ij}(k)$ has $(L+1)^2$ values including equivalent values. Namely, $T_{ij}$ has the following values:

$T_{00}, T_{01}, T_{02}, T_{03}, \ldots T_{0L}$ $T_{10}, T_{11}, T_{12}, T_{13}, \ldots T_{1L}$ $T_{20}, T_{21}, T_{22}, T_{23}, \ldots T_{2L}$ $T_{30}, T_{31}, T_{32}, T_{33}, \ldots T_{3L}$

. . . .
. . . .
. . . .

$T_{L0}, T_{L1}, T_{L2}, T_{L3}, \ldots T_{LL}.$ $T_{01}$ and $T_{10}$, $T_{02}$ and $T_{20}$, etc., represent essentially the same value. $I_i$ has the following (L+1) values:

$I_0, I_1, I_2, I_3, \ldots I_L.$

The coefficients are renewed on the bases of $T_{ij}(k)$, $I_i(k)$ and initial or unrenewed coefficients $w_i n-1(k)$ and $w_j n-1(k)$, according to the equation:

$$w_i n(k) = w_i n - 1(k) + \mu \left[ \sum_{j=0}^{L} T_{ij}(k) w_j n - 1(k) + I_i(k) \right] \quad (14)$$

where $w_i n(k)$ represents the coefficients after being renewed at each of the n renewals. Since n represents the number of times the coefficients are renewed, it may be any number from one to ten if the coefficients are to be renewed ten times. The suffixes i and j in Equation (14) have the same meanings as defined above. Thus, in Equation (14), $w_i n(k)$ represent (L+1) values:

First renewal:
$w_{01}(k), w_{11}(k), w_{21}(k), w_{31}(k), \ldots w_{L1}(k)$
Second renewal:
$w_{02}(k), w_{12}(k), w_{22}(k), w_{32}(k), \ldots w_{L2}(k)$
Third renewal:
$w_{03}(k), w_{13}(k), w_{23}(k), w_{33}(k), \ldots w_{L3}(k)$
.
.
Tenth renewal:
$w010_{(k)}, w110_{(k)}, w210(k), w310(k), \ldots x_{L10}(k).$ It is the tenth renewed set of coefficients that are supplied from the coefficient renewal circuit 32 to the respective multipliers $A_0$-$A_L$ and used as the coefficients $w_0(k)$-$w_L(k)$ in the FIG. 3 system.

The first term, $w_i n-1(k)$, of the right side of Equation (14) represents the coefficients at the end of the first renewal. Therefore, for the first renewal at the time k, the coefficients at the end of the tenth renewal of the time (k−1) of the preceding sampling period are used as the $w_{ji}n-1(k)$. Initial or unrenewed coefficients $w_{i}n-1(k)$ at each renewal are as follows:

First renewal:
$w_{00}(k), w_{10}(k), w_{20}(k), w_{30}(k), \ldots w_{L0}(k)$
Second renewal:
$w_{01}(k), w_{11}(k), w_{21}(k), w_{31}(k), \ldots w_{L0}(k)$
Third renewal:
$w_{02}(k), w_{12}(k), w_{22}(k), w_{32}(k), \ldots w_{L2}(k)$

.
.

Tenth renewal:
$w_{09}(k), w_{19}(k), w_{29}(k), w_{39}(k), \ldots w_{L9}(k)$.

Also, in Equation (14), $w_{j}n-1(k)$ is essentially equivalent to $w_{i}n-1(k)$ since j is equivalent to i. However, in this equation, $w_{j}n-1(k)$ represents all of the (L+1) coefficients whereas $w_{i}n-1(k)$ represents each specified coefficient. Equation (14) indicates that the computation of a coefficient on the arbitrary ith of the lines $C_0$–$C_L$ requires not only the initial coefficient $w_{i}n-1(k)$ on the ith line but also the initial coefficients $w_{j}n-1(k)$ on the other lines. The initial coefficient on the ith line is included in $w_{j}n-1(k)$.

Actual computations according to Equation (14) are as follows:

*First renewal:* (15)

$$w_{01}(k) = w_{00}(k) + \mu \left[ \sum_{j=0}^{L} T_0(k)w_{j0}(k) + I_0(k) \right]$$

$$w_{11}(k) = w_{10}(k) + \mu \left[ \sum_{j=0}^{L} T_1(k)w_{j0}(k) + I_1(k) \right]$$

$$w_{21}(k) = w_{20}(k) + \mu \left[ \sum_{j=0}^{L} T_2(k)w_{j0}(k) + I_2(k) \right]$$

$$w_{31}(k) = w_{30}(k) + \mu \left[ \sum_{j=0}^{L} T_3(k)w_{j1}(k) + I_3(k) \right]$$

.
.

$$w_{L1}(k) = w_{L0}(k) + \mu \left[ \sum_{j=0}^{L} T_L(k)w_{j0}(k) + I_L(k) \right]$$

Second renewal: (16)

$$w_{02}(k) = w_{01}(k) + \mu \left[ \sum_{j=0}^{L} T_0(k)w_{j1}(k) + I_0(k) \right]$$

$$w_{12}(k) = w_{11}(k) + \mu \left[ \sum_{j=0}^{L} T_1(k)w_{j1}(k) + I_1(k) \right]$$

$$w_{22}(k) = w_{21}(k) + \mu \left[ \sum_{j=0}^{L} T_2(k)w_{j1}(k) + I_2(k) \right]$$

$$w_{32}(k) = w_{31}(k) + \mu \left[ \sum_{j=0}^{L} T_3(k)w_{j1}(k) + I_3(k) \right]$$

.

$$w_{L2}(k) = w_{L1}(k) + \mu \left[ \sum_{j=0}^{L} T_L(k)w_{j1}(k) + I_L(k) \right]$$

Third renewal: (17)

$$w_{03}(k) = w_{02}(k) + \mu \left[ \sum_{j=0}^{L} T_0(k)w_{j2}(k) + I_0(k) \right]$$

$$w_{13}(k) = w_{12}(k) + \mu \left[ \sum_{j=0}^{L} T_1(k)w_{j2}(k) + I_1(k) \right]$$

$$w_{23}(k) = w_{22}(k) + \mu \left[ \sum_{j=0}^{L} T_2(k)w_{j2}(k) + I_2(k) \right]$$

$$w_{33}(k) = w_{32}(k) + \mu \left[ \sum_{j=0}^{L} T_3(k)w_{j2}(k) + I_3(k) \right]$$

.
.

$$w_{L3}(k) = w_{L2}(k) + \mu \left[ \sum_{j=0}^{L} T_L(k)w_{j2}(k) + I_L(k) \right]$$

Tenth renewal: (18)

$$w_{010}(k) = w_{09}(k) + \mu \left[ \sum_{j=0}^{L} T_0(k)w_{j9}(k) + I_0(k) \right]$$

$$w_{110}(k) = w_{19}(k) + \mu \left[ \sum_{j=0}^{L} T_1(k)w_{j9}(k) + I_1(k) \right]$$

$$w_{210}(k) = w_{29}(k) + \mu \left[ \sum_{j=0}^{L} T_2(k)w_{j9}(k) + I_2(k) \right]$$

$$w_{310}(k) = w_{39}(k) + \mu \left[ \sum_{j=0}^{L} T_3(k)w_{j9}(k) + I_3(k) \right]$$

.
.

$$w_{L10}(k) = w_{L9}(k) + \mu \left[ \sum_{j=0}^{L} T_L(k)w_{j9}(k) + I_L(k) \right]$$

It is thus seen that the set of coefficients renewed at each of the ten renewals are used as initial values at the next renewal. For instance, $w_{10}(k)$ used for computing the coefficient on 0'th line $C_0$ at the second renewal is the coefficient $w_{01}(k)$ renewed at the first renewal. Further, $w_{j1}(k)$ included in Equations (16) for the second renewal represents $w_{01}(k), w_{11}(k), w_{21}(k), w_{31}(k), \ldots w_{L1}(k)$ and thus agrees with the coefficients renewed at the first renewal.

Figure 4:
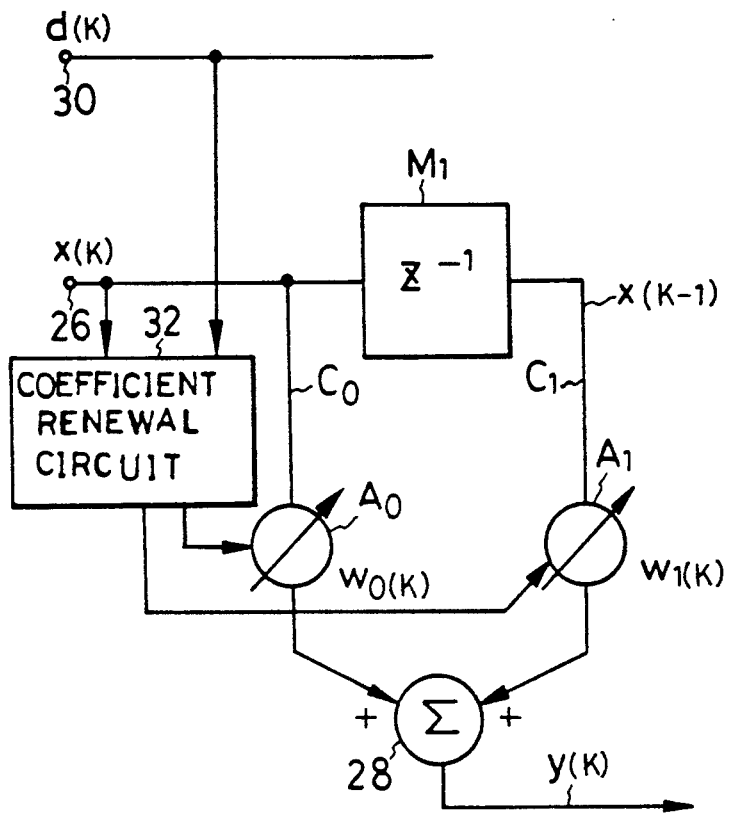
FIG. 4 shows the FIG. 3 system in its most simplified form for the ease of understanding.

The reader's attention is now invited to FIG. 4 for a better understanding of how the coefficients are renewed according to the invention, with the coefficients $w_0(k)$ and $w_1(k)$ taken for example. It has been stated that as one data sample x(k) is received at the data input 26 at any discrete time k, the first delay element $M_1$ puts out a data sample x(k−1) of the preceding sampling time, so that the two data samples x(k) and x(k−1) are obtained concurrently on the lines $C_0$ and $C_1$. At the multipliers $A_0$ and $A_1$ the data samples x(k) and x(k−1) are multiplied by the respective coefficients $w_0(k)$ and $w_1(k)$. The resulting outputs $x(k)w_0(k)$ and $x(k-1)w_1(k)$ are added into y(k) by the adder 28.

Let us assume for the convenience of disclosure that the coefficients are renewed twice, rather than ten times as set forth above, during each sampling period. First of all, $T_{ij}(k)$ and $I_i(k)$ are obtained according to Equations (13) from the two input samples x(k) and x(k−1) and reference signal d(k) at the time k. $T_{ij}(k)$ is:

−2x(k)x(k) [let this be $T_{00}(k)$],

−2x(k−1)x(k) [$T_{01}(k)$],

−2x(k)x(k−1) [$T_{10}(k)$], and $$-2x(k-1)x(k-1)\,[T_{11}(k)].$$

$I_f(k)$ is:

$$2d(k)x(k)\,[I_0(k)]$$

and $$2d(k)x(k-1)\,[I_1(k)].$$

Then the first and second initial coefficients $w_{00}(k+1)$ and $w_{10}(k+1)$, for use at the next sampling time $(k+1)$, are determined from the above determined $T_{00}(k)$, $T_{01}(k)$, $T_{10}(k)$, $T_{11}(k)$, $I_0(k)$ and $I_1(k)$, the first and second unrenewed coefficients $w_{00}(k)$ and $w_{10}(k)$ and the stepsize $\mu$. The first coefficient renewed for the first time, $w_{01}(k)$, is obtained as follows according to Equation (14):

$$w_{01}(k)=w_{00}(k)+\mu[T_{00}(k)w_{00}(k)+T_{01}(k)w_{10}(k)+I_{0^-}(k)] \quad (19).$$

For renewal of the coefficient on the line $C_0$, i in Equation (14) is fixed at 0, so that $w_i$, $T_{ij}$ and $I_i$ are $w_{00}$, $T_{00}$, $T_{01}$ and $I_0$. The second coefficient renewed for the first time, $w_{11}(k)$, is likewise determined according to Equation (14):

$$w_{11}(k)=w_{10}(k)+\mu[T_{10}(k)w_{00}(k)+T_{11}(k)w_{10}(k)I_f(k)] \quad (20).$$

For renewal of the coefficient on the line $C_1$, i in Equation (14) is fixed at 1, so that $w_i$, $T_{ij}$ and $I_i$ are $w_{10}$, $T_{10}$, $T_{11}$ and $I_1$.

Then the first coefficient renewed for the second time, $w_{02}(k)$, is obtained as follows according to Equation (14):

$$w_{02}(k)=w_{01}(k)+\mu[T_{00}(k)w_{01}(k)+T_{01}(k)w_{11}(k)+I_{0^-}(k)] \quad (21).$$

The second coefficient renewed for the second time, $w_{12}(k)$, is likewise obtained as follows according to Equation (14):

$$w_{12}(k)=w_{11}(k)+\mu[T_{10}(k)w_{01}(k)+T_{11}(k)w_{11}(k)+I_{1^-}(k)] \quad (22).$$

Then the two coefficients renewed for the second time as above, $w_{02}(k)$ and $w_{12}(k)$, are directed into the respective multipliers $A_0$ and $A_1$. The input data samples $x(k+1)$ and $x(k)$ of the next sampling time $(k+1)$ are multiplied by the respective coefficients $w_{02}(k)$ and $w_{12}(k)$.

With the coefficients renewed twice, as set forth in the foregoing with reference to FIG. 4, the time constant will become half that of the conventional method. However, for still higher convergence, the coefficients may be renewed a greater number of times in a like manner.

Figure 5:
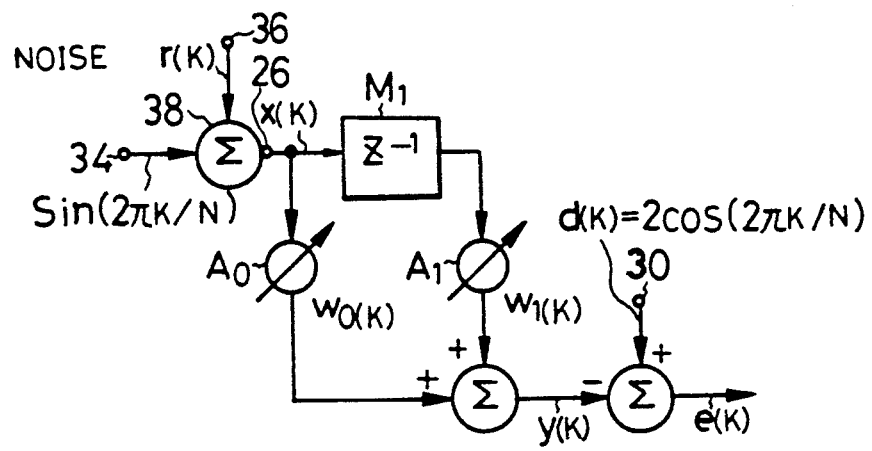
FIG. 5 is a schematic electrical diagram of a circuit for testing the convergence of the FIG. 3 system.

The convergence of the adaptive digital filter 20 according to the invention was tested by the circuitry shown in FIG. 5. The test circuitry had two input terminals 34 and 36 connected to an adder 38 on the preceding stage of the data input 26. A sinusoidal wave of sin $(2\pi k/N)$, where N represents an arbitrary number, was supplied to the first input terminal 34, and white noise $r(k)$ with an average of 0 and a variance of 0.01 to the second input terminal 36. The two inputs were combined into the input signal $x(k)$ supplied to the data input 26. The reference signal $d(k)$ received at the reference signal input 30 was $2 \cos (2\pi k/N)$.

Figure 6:
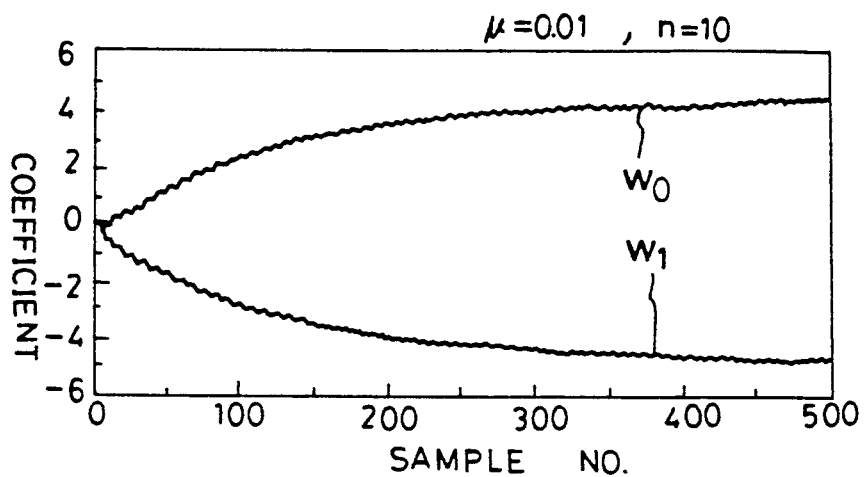
FIG. 6 is a graphic representation of the results of a test conducted by use of the FIG. 5 circuit.
Figure 7:
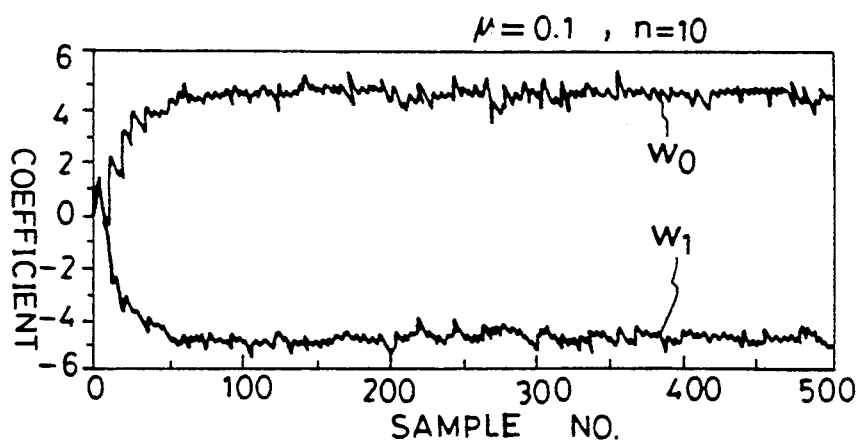
FIG. 7 is a similar representation of the results of another test conducted by use of the FIG. 5 circuit.
Figure 8:
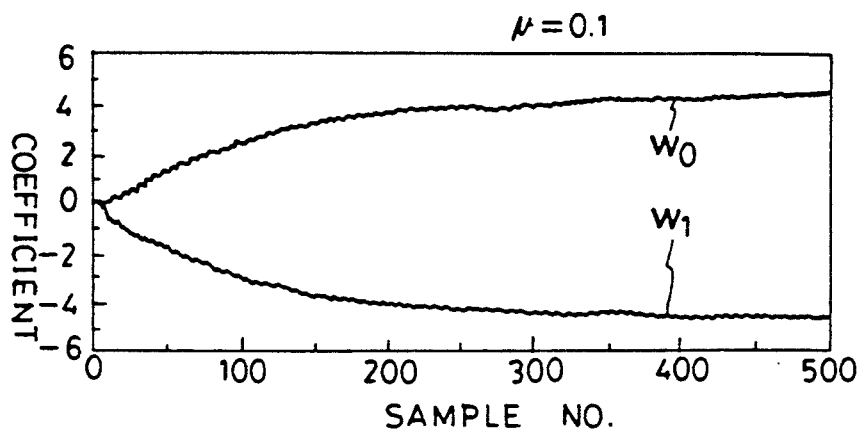
FIG. 8 is a similar representation of the results of testing a prior art system by use of the FIG. 5 circuit.

FIGS. 6 and 7 are graphic analog representations of the variations of the coefficients $w_0$ and $w_1$ according to the FIG. 5 test circuitry. FIG. 8 is a similar representation of the variations of the coefficients according to the prior art method wherein the coefficients are renewed only once during each sampling period on the basis of the difference signal $e(k)$. The sample numbers on the horizontal axes of FIGS. 6–8 start from Sample No. 0 at the time k, so that the horizontal axes represent time. The stepsize constant $\mu$ was 0.01, and the number n of renewals was 10, in FIG. 6; $\mu$ was 0.10, and n was 10, in FIG. 7; and $\mu$ was 0.10 in FIG. 8.

A comparison of FIGS. 6 and 7 indicates that the adaptive filter system according to the invention is just as favorable in convergence if the stepsize is made of one tenth of that of the prior art. A comparison of FIGS. 7 and 8, on the other hand, proves that convergence greatly improves according to the invention if the stepsize is the same as in the prior art. This is evident from the fact that convergence occurs at Sample No. 50 in FIG. 7 according to the invention, and at Sample No. 500 in FIG. 8 according to the prior art.

Admittedly, the variations of the coefficients are more pronounced in FIG. 7 than in FIG. 8. The present invention may therefore be employed advantageously in applications where convergence is of greater significance than such variations. Of course, as desired or required, the number n of coefficient renewals may be varied according to the degree of convergence; that is, the number n may be made high during a period of adaptation and decreased after convergence.

Figure 3:
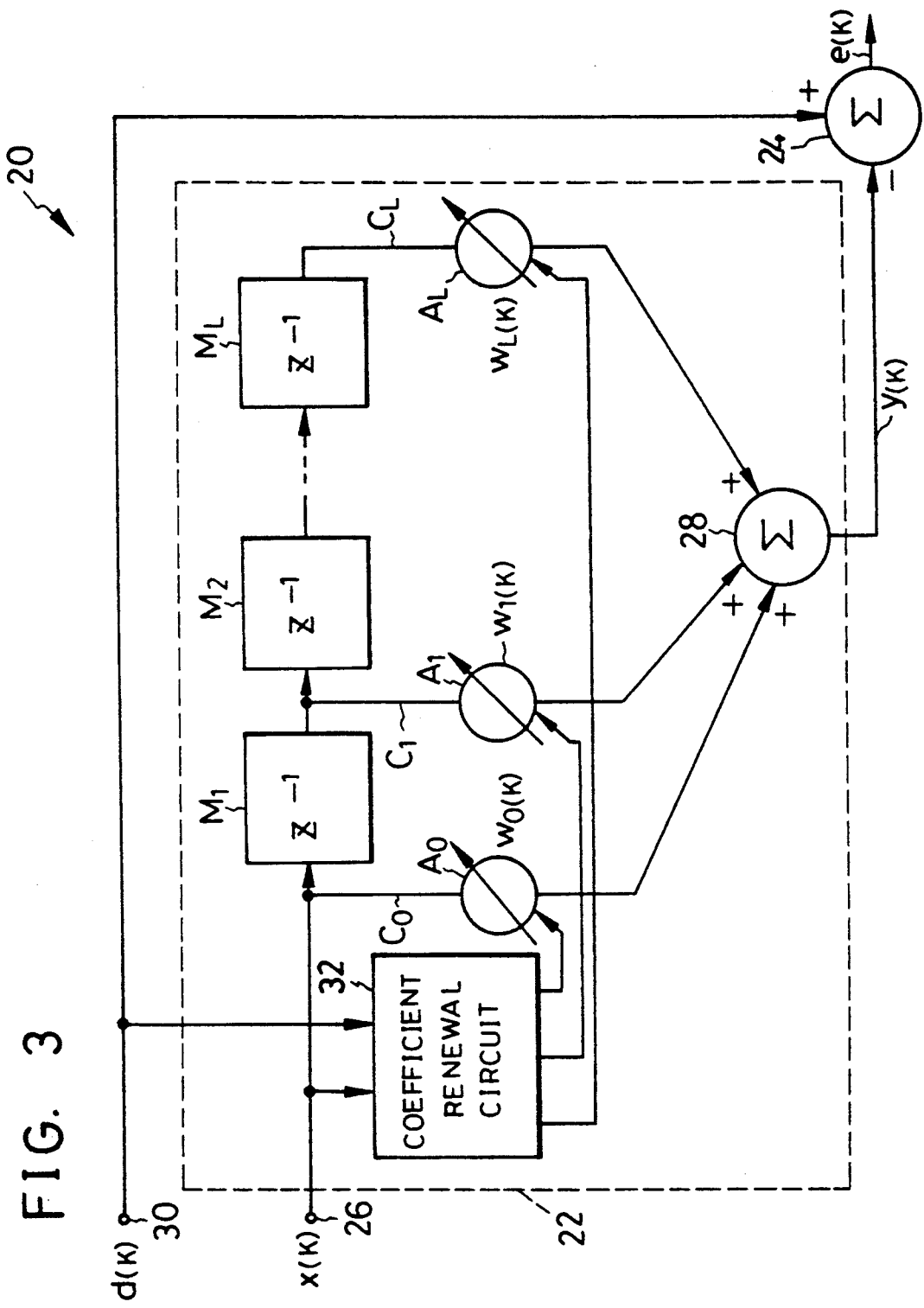
FIG. 3 is a block diagram of the adaptive digital filter system in accordance with the invention.
Figure 9:
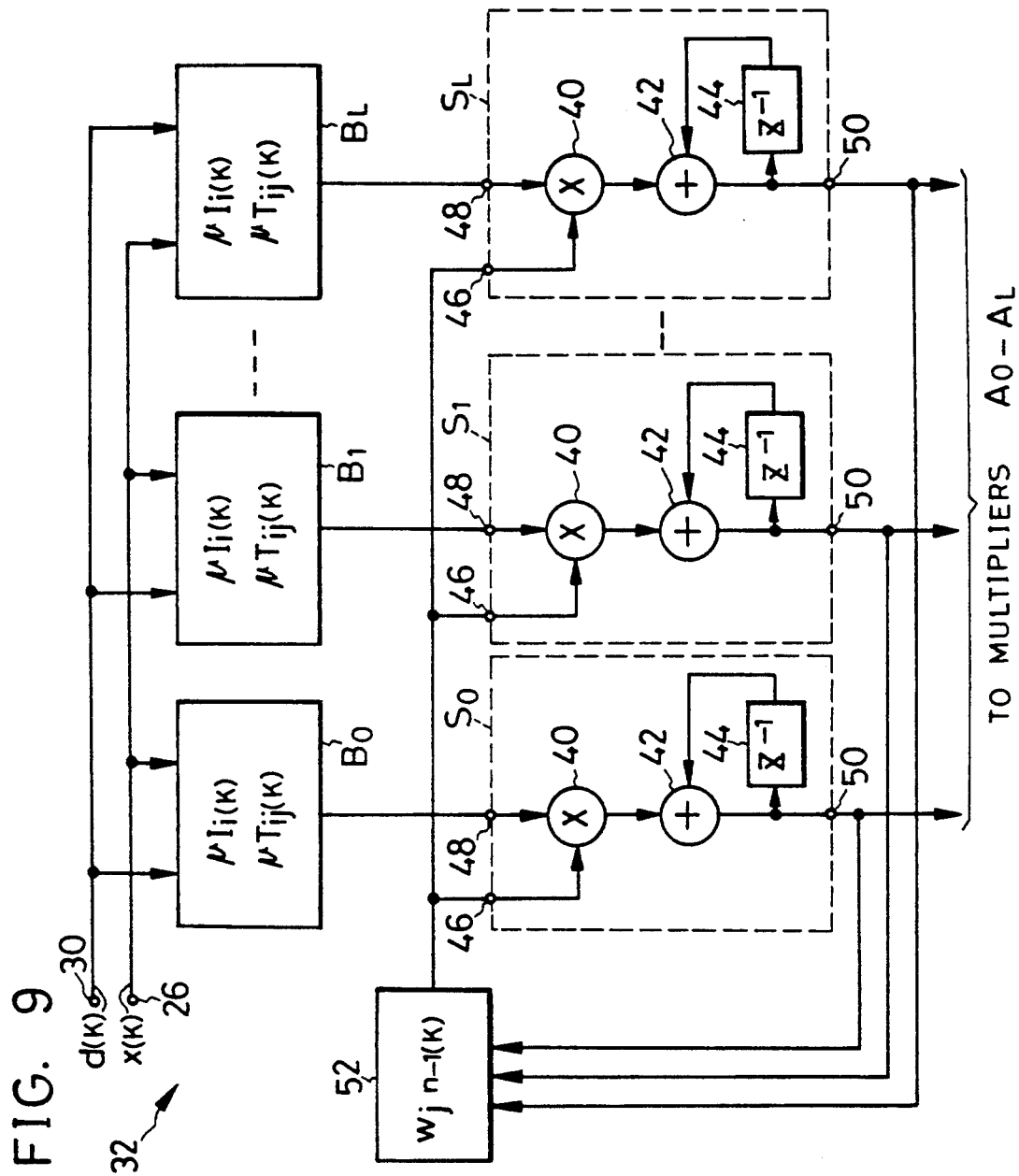
FIG. 9 is a block diagram showing the coefficient renewal circuit of the FIG. 3 system in detail.

FIG. 9 is a detailed illustration of an example of coefficient renewal circuit 32 in the adaptive filter system 20 FIG. 3. The exemplified coefficient renewal circuit 32 has $(L+1)$ arithmetic circuits $S_0, S_1, \ldots S_L$ each for performing arithmetic operations necessary for renewing one of the $(L+1)$ coefficients. Each arithmetic circuit comprises a multiplier 40, an adder 42 and a delay circuit 44. The multiplier 40 has its inputs connected to two circuit inputs 46 and 48, respectively. The adder 42 has two inputs connected respectively to the multiplier 40 and to the delay circuit 44 which may take the form of a memory in practice. The output of the adder 42 is connected to both the delay circuit 44 and a circuit output 50.

The inputs 46 of all the arithmetic circuits $S_0$–$S_L$ are connected to a data supply circuit 52 which puts out data representative of both unrenewed or initial coefficients $w_j n-1(k)$ and the digit 1. As has been stated, $w_j n-1(k)$ represents the $(L+1)$ coefficients $W_0 n-1(k)$, $w_1 n-1(k), \ldots w_L n-1(k)$ on the respective lines $C_0, C_1, \ldots C_L$ of FIG. 3. The data supply circuit 52 has therefore inputs connected to the outputs 50 of all the arithmetic circuits $S_0$–$S_L$, which outputs are also connected to the respective multipliers $A_0$–$A_L$ of FIG. 3

The other inputs 48 of the arithmetic circuits $S_0$–$S_L$ are connected respectively to $(L+1)$ data supply circuits $B_0$–$B_L$. These data supply circuits compute the product of the value $T_{ij}(k)$ and the stepsize $\mu$, and the product of the value $I_i(k)$ and the stepsize $\mu$, according to Equations (13) and put out data representative of the products $\mu T_{ij}(k)$ and $\mu I_i(k)$. For computing these products the data supply circuits $B_0$–$B_L$ have their inputs connected to both the data input 26 and the reference signal input 30.

Despite the showing of FIG. 9, however, the products $T_{ij}(k)$ and $I_j(k)$ needed for renewal of the (L+1) coefficients differ for all the data supply circuits $B_0$–$B_L$. For example, the 0'th data supply circuit $B_0$ puts out $\mu T_{00}(k)$, $\mu T_{01}(k)$, $\mu T_{02}(k)$, ... $\mu T_{0L}(k)$ as $\mu T_{ij}(k)$, and $\mu I_1(k)$ as $\mu I_j(k)$. The L'th data supply circuit $B_L$ puts out $\mu T_{L0}(k)$, $\mu T_{L1}(k)$, $\mu T_{L2}(k)$, ... $\mu T_{LL}(k)$ as $\mu T_{ij}(k)$, and $\mu I_L(k)$ as $\mu I_j(k)$.

In the operation of the coefficient renewal circuit 32, the data supply circuit 52 periodically and successively delivers the (L+1) initial values, labeled $w_{j}n-1(k)$ in Equation (14), to the multipliers 40 of the arithmetic circuits $S_0$–$S_L$. However, when the system is turned on, $w_jn-1(k)$ is zero or, alternatively, may be one or any other constant.

Simultaneously, the data supply circuits $B_0$–$B_L$ delivers $\mu T_{ij}(k)$ to the multipliers 40 of the arithmetic circuits $S_0$–$S_L$, respectively. $\mu T_{ij}(k)$ represents as aforesaid $\mu T_{0j}(k)$, $\mu T_{1j}(k)$, $\mu T_{2j}(k)$, ... $\mu T_{Lj}(k)$. Since the suffix j stands for (L+1) values from 0 to L, the 0'th data supply circuit $B_0$ successively puts out $\mu T_{00}(k)$, $\mu T_{01}(k)$, $\mu T_{02}(k)$, ... $\mu T_{0L}(k)$ as $\mu T_{ij}(k)$. Similarly, the first data supply circuit $B_1$ successively puts out $\mu T_{10}(k)$, $\mu T_{11}(k)$, $\mu T_{12}(k)$, ... $\mu T_{1L}(k)$ as $\mu T_{ij}(k)$. Also, the L'th data supply circuit $B_L$ successively puts out $\mu T_{L0}(k)$, $\mu T_{L1}(k)$, $\mu T_{L2}(k)$, ... $\mu T_{LL}(k)$ as $\mu T_{ij}(k)$.

Receiving the inputs as above, the arithmetic circuits $S_0$–$S_L$ performs arithmetic operations according to Equation (14). Initially, the delay circuits 44 has no data stored therein. However, repeating computations according to Equation (18) in response to the $\mu I_j(k)$ and $\mu T_{ij}(k)$ data from the data supply circuits $B_0$–$B_L$, the arithmetic circuits $S_0$–$S_L$ will start producing coefficient outputs.

Let us assume for the ease of explanation that the data supply circuit 52 already received the initial values $w_jn-1(k)$ from the arithmetic circuits $S_0$–$S_L$ at the previous sampling time (k−1), and that the delay circuits 44 has the initial values $w_jn-1(k)$ stored therein. Then the data supply circuit 52 will successively produce the (L+1) initial coefficients $w_jn-1(k)$ in order to enable the arithmetic circuits $S_0$–$S_L$ to perform the computations of Equations (15) for the first coefficient renewal at the time k. $w_jn-1(k)$ represents as aforesaid $w_{00}(k)$, $w_{10}(k)$, $w_{20}(k)$, ... $w_{L0}(k)$ when n−1=0.

Thus, as the data supply circuit first puts out $w_{00}(k)$, all the arithmetic circuits $S_0$–$S_L$ will concurrently start computing $w_{01}(k)$, $w_{11}(k)$, ... $w_{L1}(k)$ in Equations (15). All Equations (15) contain $w_{j0}(k)$, so that the data supply circuit 52 can simultaneously deliver $w_{j0}(k)$ to all the arithmetic circuits $S_0$–$S_L$. Since $w_{j0}(k)$, which corresponds to $w_jn-1(k)$, represents (L+1) values $w_{00}(k)$, $w_{10}(k)$, $w_{20}(k)$, ... $w_{L0}(k)$, the data supply circuit 52 will first put out $w_{00}(k)$ as $w_jn-1(k)$.

At the arithmetic circuits $S_0$–$S_L$, the multipliers 40 will compute $\mu T_{01}(k)w_{10}(k)$ as $\mu T_{0j}(k)w_{j0}(k)$ which corresponds to $\mu T_{ij}w_jn-1(k)$. $\mu T_{01}(k)$ is supplied from $B_0$. Then the adders 42 will add the multiplier outputs $\mu T_{01}(k)w_{10}(k)$ and the delay circuit outputs $w_{00}(k) + \mu T_{00}(k)w_{00}(k)$ to each other into $W_{00}(k) + \mu T_{00}(k)w_{00}(k) + \mu T_{10}(k)w_{10}(k)$. The adder outputs are held in the delay circuits 44. Then the multipliers 40 will successively multiply the other values $w_{20}(k)$–$w_{L0}(k)$ of $w_{j0}(k)$ by $\mu T_{0j}(k)$. There can thus be obtained the values for $$w_{00}(k) + \mu \left[ \sum_{j=0}^{L} T_{0j}(k)w_{j0}(k) \right]$$

in Equations (15) which corresponds to $$w_jn - 1(k) + \mu \left[ \sum_{i=0}^{L} T_{ij}(k)w_jn - 1(k) \right]$$

in Equation (14).

Then, in order to add $I_0(k)$ in Equations (15) which corresponds to $I_j(k)$ in Equation (14), the data supply circuit 52 will deliver the digit "1", and the data supply circuit $B_0$–$B_L$ will deliver $\mu I_0(k)$, to the multiplier 40. Consequently, $\mu I_0(k)$ will pass unchanged through the multiplier 40. Then, at the adder 42, $\mu I_0(k)$ will be added to the delay circuit output $$w_{00}(k) + 82 \left[ \sum_{j=0}^{L} T_{0j}(k)w_{j0}(k) \right].$$

The first renewal of the first coefficient, as well as of all the other coefficients, has now been completed according to Equations (15). All the coefficients, concurrently renewed for the first time as above, will be held in the delay circuits 44 and also delivered to the data supply circuit 52.

Then the coefficients will be renewed for the second time according to Equations (16) and then for the third time according to Equations (17). The same procedure will be repeated thereafter until the coefficients are renewed for the tenth time according to Equations (18). The ten renewals will be performed far more quickly than heretofore because all the coefficients are renewed simultaneously at each time.

The tenth renewed coefficients $w_{010}(k)$–$w_{L10}(k)$ will be supplied to the respective multipliers $A_0$–$A_L$ as the renewed coefficients for use at the time (k+1). Also, the tenth renewed coefficients will be held in the delay circuits 44 and further directed into the data supply circuit 52, for use as the initial coefficients to be renewed during the next sampling period from time (k+1) to time (k+2).

Figure 10:
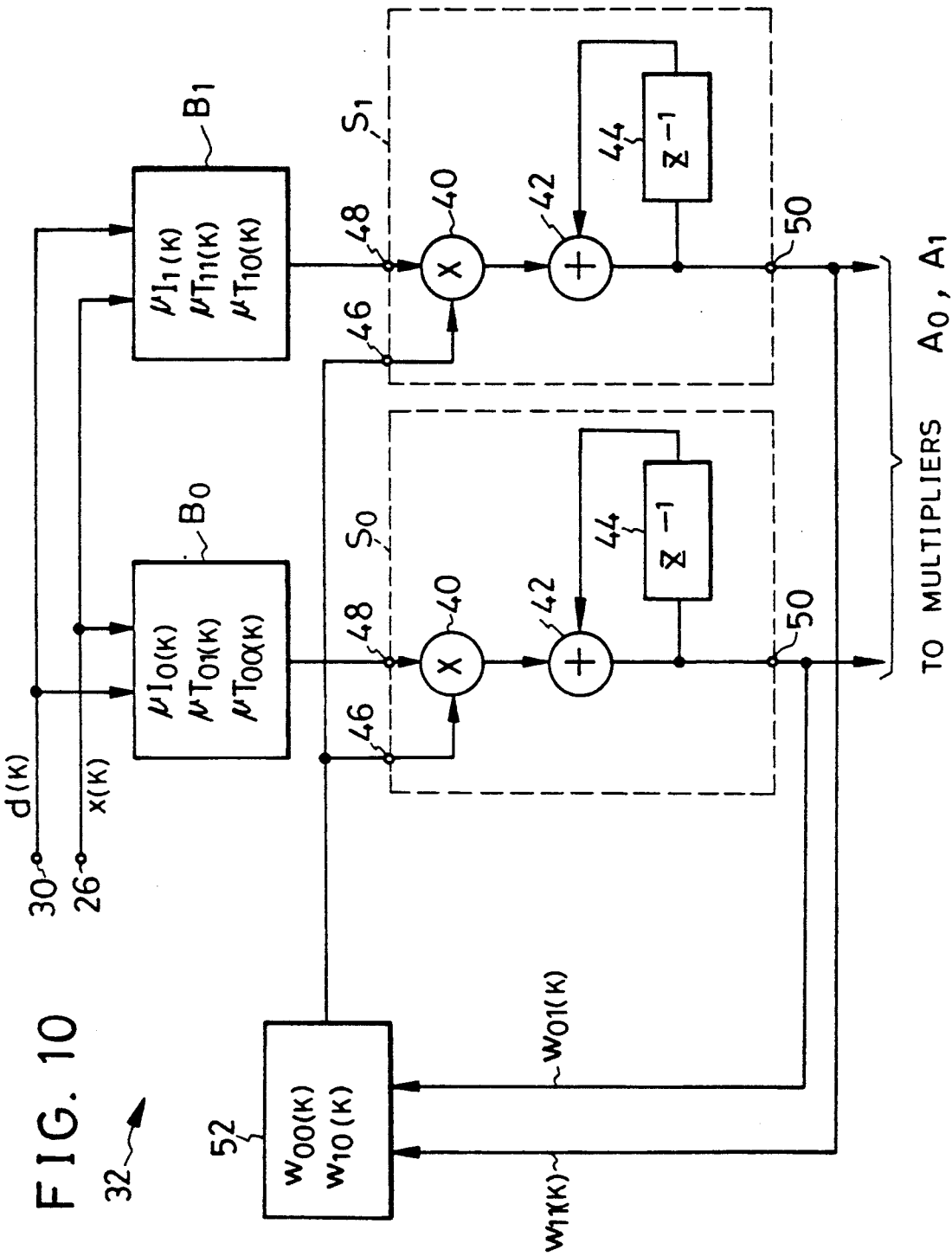
FIG. 10 shows the FIG. 9 circuit in simplified form for the ease of understanding.

The foregoing description of FIG. 9 will be better understood by referring to FIG. 10, in which the coefficient renewal circuit 32 of FIG. 9 is shown simplified, having but two arithmetic circuits $S_0$ and $S_1$ and two associated data supply circuits $B_0$ and $B_1$. Let it also be assumed for simplicity that the two coefficients are renewed only twice during each sampling interval.

Thus the data supply circuit 52 stores the initial coefficients $w_{00}(k)$ and $w_{10}(k)$, corresponding to $w_jn-1(k)$ in FIG. 9, for use at the first renewal, as well as the digit "1". The data supply circuit $B_0$ stores $\mu T_0(k)$, corresponding to $\mu I_j(k)$ in FIG. 9, and $\mu T_{00}(k)$ and $\mu T_{01}(k)$, corresponding to $\mu T_{ij}(k)$ in FIG. 9. The data supply circuit $B_1$ similarly stores $\mu I_1(k)$, $\mu T_{10}(k)$ and $\mu T_{11}(k)$.

Equations for the first renewal of the two coefficients are, according to Equations (19) and (20):

$w_{01}(k) = w_{00}(k) + \mu[T_{00}(k) w_{00}(k) + T_{01}(k) w_{10}(k) + I_0(k)]$ $w_{11}(k) = w_{10}(k) + \mu[T_{10}(k) w_{00}(k) + T_{11}(k) w_{10}(k) + I_1(k)]$.

The first renewal of the coefficients starts as the data supply circuit 52 delivers the first coefficient $w_{00}(k)$, which has been determined at the previous sampling time $(k-1)$, to the multipliers 40 of the two arithmetic circuits $S_0$ and $S_1$. Simultaneously, the data supply circuits $B_0$ and $B_1$ supply $\mu T_{00}(k)$ and $\mu T_{10}(k)$ to the respective multipliers 40. Thus the multipliers 40 will put out $\mu T_{00}(k)w_{00}(k)$ and $\mu T_{10}(k)w_{00}(k)$, respectively.

Then, at the adders 42, the unrenewed coefficients $w_{00}(k)$ and $w_{10}(k)$ which have been held in the delay circuits 44 will be added to the multiplier outputs:

$$w_{00}(k)+\mu T_{00}(k)\,w_{00}(k)$$

$$w_{10}(k)+\mu T_{10}(k)\,w_{00}(k).$$

The delay circuits 44 will hold the respective sums thus obtained. Then the data supply circuit 52 will deliver $w_{10}(k)$ to the multipliers 40 of both arithmetic circuits $S_0$ and $S_1$, and the data supply circuits $B_0$ and $B_1$ will also deliver $\mu T_{01}(k)$ and $\mu T_{11}(k)$ to the respective multipliers 40, with the consequent production of $\mu T_{01}(k)w_{10}(k)$ and $\mu T_{11}(k)w_{10}(k)$ from the multipliers. Then the adders 42 will add the delay circuit outputs to the multiplier outputs:

$$w_{00}(k)+\mu T_{00}(k)\,w_{00}(k)+\mu T_{01}(k)\,w_{10}(k)$$

$$w_{10}(k)+\mu T_{10}(k)\,w_{00}(k)+\mu T_{11}(k)\,w_{10}(k).$$

The delay circuits 44 will hold the respective sums thus obtained. Then the data supply circuit 52 will deliver the digit "1" to both multipliers 40, and the data supply circuits $B_0$ and $B_1$ will deliver $\mu I_0(k)$ and $\mu I_1(k)$ to the respective multipliers 40. The resulting outputs from the multipliers 40, $\mu I_0(k)$ and $\mu I_1(k)$ will be added to the delay circuit outputs by the adders 42:

$$w_{00}(k)+\mu T_{00}(k)\,w_{00}(k)+\mu T_{01}(k)\,w_{10}(k)+\mu I_0(k).$$

$$w_{10}(k)+\mu T_{10}(k)\,w_{00}(k)+\mu T_{11}(k)\,w_{10}(k)+\mu I_1(k)$$

These computations are in accordance with Equations (19) and (20). The thus renewed coefficients satisfy Equation (14). The first renewal of the two coefficients has now been completed. The renewed coefficients $w_{01}(k)$ and $w_{11}(k)$ are stored in the respective delay circuits 44 and in the data supply circuit 52.

Then the second renewal of the coefficients is conducted according to Equations (21) and (22):

$$w_{02}(k)=w_{01}(k)+\mu[T_{00}(k)\,w_{01}(k)+T_{01}(k)\,w_{11}(k)+I_0(k)]$$

$$w_{12}(k)=w_{11}(k)+\mu[T_{10}(k)\,w_{01}(k)+T_{11}(k)\,w_{11}(k)+I_1(k)].$$

For these computations the data supply circuit 52 will supply $w_{11}(k)$ to the multipliers 40 of both arithmetic circuits $S_0$ and $S_1$, and the data supply circuits $B_0$ and $B_1$ will supply $\mu T_{00}(k)$ and $\mu T_{10}(k)$ to the respective multipliers 40. Then the adders 42 will add the resulting multiplier outputs, $\mu T_{00}(k)\,w_{01}(k)$ and $\mu T_{10}(k)\,w_{01}(k)$, to $w_{01}(k)$ and $w_{11}(K)$ that have been held in the respective delay circuits 44:

$$w_{01}(k)+\mu T_{00}(k)\,w_{01}(k)$$

$$w_{11}(k)+\mu T_{10}(k)\,w_{01}(k).$$

The resulting outputs from the adders 42 will be held in the delay circuits 44. Then the data supply circuit will supply $w_{11}(k)$ to both multipliers 40, and the data supply circuits $B_0$ and $B_1$ will supply $\mu T_{01}(k)$ and $\mu T_{11}(k)$ to the respective multipliers 40. Then the adders 42 will add the resulting multiplier outputs, $\mu T_{01}(k)\,w_{11}(k)$ and $\mu T_{11}(k)\,w_{11}(k)$, to the above values that have been held in the delay circuits 44:

$$w_{01}(k)+\mu T_{00}(k)\,w_{01}(k)+\mu T_{01}(k)\,w_{11}(k)$$

$$w_{11}(k)+\mu T_{10}(k)\,w_{01}(k)+\mu T_{11}(k)\,w_{11}(k).$$

The resulting outputs from the adders 42 will be held in the delay circuits 44. Then the data supply circuit will supply the digit "1" to both multipliers 40, and the data supply circuits $B_0$ and $B_1$ will supply $\mu I_0(k)$ and $\mu I_1(k)$ to the respective multipliers 40. Then the adders 42 will add the resulting multiplier outputs, $\mu I_0(k)$ and $\mu I_1(k)$, to the delay circuit outputs:

$$w_{01}(k)+\mu T_{00}(k)\,w_{01}(k)+\mu T_{01}(k)\,w_{11}(k)+\mu I_0(k)$$

$$w_{11}(k)+\mu T_{10}(k)\,w_{01}(k)+\mu T_{11}(k)\,w_{11}(k)+\mu I_1(k).$$

Now the second renewed coefficients $w_{02}(K)$ and $w_{12}(k)$ have been obtained in accordance with Equations (21) and (22). These renewed coefficients will be supplied to the respective multipliers $A_0$ and $A_1$ for use at the sampling time $(k+1)$. Also, the second renewed coefficients will be held in the delay circuits 44 and further directed into the data supply circuit 52, for use as the initial coefficients to be renewed during the next sampling period from time $(k+1)$ to time $(k+2)$.

Despite the foregoing detailed disclosure, it is not desired that the present invention be limited by the exact details of such disclosure. For example, each arithmetic circuit could take a variety of forms other than that shown in FIGS. 9 and 10. Also, the data supply circuits $B_0$–$B_L$ associated with the respective arithmetic circuits $S_0$–$S_L$ could be combined into a single circuit. These and other modifications, alterations and adaptations of the invention may be resorted to without departure from the scope of the invention as expressed in the following claims.

What is claimed is:

1. An adaptive digital filter system of the type having first input means for inputting samples of a reference signal at predetermined sampling times, second input means for inputting at the predetermined sampling times samples of data which is associated with the reference signal, and a filter circuit for imparting a unit delay of one interval between the predetermined sampling times to the successive input data samples in order to concurrently obtain a set of $(L+1)$ data samples of different sampling times, from 0'th to L'th, where L is an integer greater than one, for multiplying the set of data samples by respective coefficients $W_0(k), W_1(k), \ldots W_L(k)$, and for adding together the set of multiplied data samples into a sum $y(k)$, the filter circuit including a coefficient renewal circuit for renewing the coefficients for each set of input data samples by computing the following equations from a reference signal $d(k)$ and set of $(L+1)$ data samples at any one sample time K;

$$T_{ij}(k)=-2x(k-i)x(k-j)$$

$$I_i(k)=2d(k)x(k-i)$$

where
i and j = variables denoting the numbers from 0 to L
$T_{ij}(k) = (L+1)^2$ values, including like values, used for the renewal of the coefficients
$I_i(k) = (L+1)$ values used for the renewal of the coefficients
$x(k-i) = (L+1)$ data samples chosen successively from the set of data samples
$x(k-j) = (L+1)$ data samples chosen successively from the set of data samples, by renewing the set of (L+1) data samples n times, where n is an integer not less than two, during a time interval from the sampling time k to the next sample time (k+1) according to the equation:

$$w_{i,n}(k) = w_{i,n} - 1(k) + \mu \left( \sum_{j=0}^{L} T_{ij}(k) 7 w_{j,n} - 1(k) + I_i(k) \right)$$

where
$w_{i,n-1}(k) = (L+1)$ unrenewed coefficients to be renewed at each of the n renewals
$w_{i,n}(k) = (L+1)$ renewed coefficients at each of the n renewals $\mu$ = stepsize constant
$w_{j,n} - 1(k) = (L+1)$ unrenewed coefficients to be renewed at each of then n renewals, and by using the coefficients renewed at the last of the n renewals as coefficients by which a set of data samples obtained at the next sampling time (k+1) are to be multiplied, the adaptive digital filter system being characterized in that the coefficient renewal circuit comprises:

(a) first data supply means for supplying the (L+1) unrenewed coefficients $w_{i,n} - 1(k)$ to be renewed at each of the n renewals and an unit value;

(b) second data supply means connected to the first and the second input means for supplying the products $\mu T_{ij}(k)$ of $T_{ij}(k)$ and $\mu$, and the products $\mu I_i(k)$ of $I_i(k)$ and $\mu$; and (c) (L+1) arithmetic circuits each having inputs connected to the first and the second data supply means and an output connected to the first data supply means, the arithmetic circuits simultaneously conducting the n renewals of the set of (L+1) data samples and putting out the coefficients renewed at the last of the n renewals;

wherein each arithmetic circuit comprises:

(a) a multiplier having a first input connected to the first data supply means and a second input connected to the second data supply means;

(b) an adder connected between the multiplier and the output of the arithmetic circuit; and (c) a delay circuit connected to the adder for delaying an output from the adder by one interval between the predetermined sampling times for application to the adder.

* * * * *